United States Patent
Best

(10) Patent No.: US 10,321,592 B2
(45) Date of Patent: Jun. 11, 2019

(54) ELECTRONICS HOUSING

(71) Applicant: PHOENIX CONTACT GmbH & Co. KG, Blomberg (DE)

(72) Inventor: Frank Best, Bueckeburg (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 15/493,166

(22) Filed: Apr. 21, 2017

(65) Prior Publication Data

US 2017/0311463 A1  Oct. 26, 2017

(30) Foreign Application Priority Data

Apr. 22, 2016  (DE) .................... 20 2016 002 626 U
Sep. 16, 2016  (DE) ........................ 10 2016 117 451

(51) Int. Cl.
*H05K 5/02* (2006.01)
*H02B 1/32* (2006.01)
*H05K 5/03* (2006.01)

(52) U.S. Cl.
CPC ............ *H05K 5/0221* (2013.01); *H02B 1/32* (2013.01); *H05K 5/0204* (2013.01); *H05K 5/0226* (2013.01); *H05K 5/0239* (2013.01); *H05K 5/03* (2013.01)

(58) Field of Classification Search
CPC ...... H05K 5/0221; H05K 5/03; H05K 5/0204; H05K 5/0226; H05K 5/0239; H02B 1/32; H01H 9/22
USPC .................... 312/265.1, 265.4, 334.4, 405.1; 220/4.02, 4.21, 4.22, 4.23
See application file for complete search history.

(56) References Cited

U.S. PATENT DOCUMENTS

| 1,326,333 A | * | 12/1919 | Frank ..................... | B65D 85/12 |
| | | | | 16/337 |
| 5,445,452 A | * | 8/1995 | Kauffman ............... | F25D 23/04 |
| | | | | 312/321.5 |
| 6,422,399 B1 | * | 7/2002 | Castillo .................. | A47B 57/40 |
| | | | | 211/175 |

(Continued)

FOREIGN PATENT DOCUMENTS

| DE | 9003518 U1 | 5/1990 |
| DE | 9406359 U1 | 6/1994 |

(Continued)

*Primary Examiner* — James O Hansen
(74) *Attorney, Agent, or Firm* — Leydig, Voit & Mayer, Ltd.

(57) ABSTRACT

An electronics housing includes: a housing body for attachment to a mounting rail and on which a cover is arranged which is pivotable about a pivot pin, formed on a bearing point, between an open position and a closed position; and a locking device for pivotally locking the cover in at least one pivot angle position via an interlocking connection, which is configured to be released without destruction, between at least a first and a second locking member, wherein, spaced apart from the bearing point in a radial pivot pin direction, the first locking member is arranged on the housing body and the second locking member is arranged on the cover such that actuation of the cover for pivoting out of the pivot angle position produces resilient deformation of the first locking member and/or second locking member, directed radially with respect to the pivot pin, to release the interlocking connection.

12 Claims, 4 Drawing Sheets

(56) References Cited

U.S. PATENT DOCUMENTS

| | | | |
|---|---|---|---|
| 2006/0061247 A1* | 3/2006 | Lee | F25D 23/04 |
| | | | 312/404 |
| 2013/0127318 A1* | 5/2013 | Chen | H05K 5/0226 |
| | | | 312/327 |
| 2015/0257294 A1 | 9/2015 | Murata et al. | |

FOREIGN PATENT DOCUMENTS

| | | |
|---|---|---|
| DE | 102009055817 B4 | 6/2012 |
| JP | H 0631522 Y2 | 8/1994 |
| WO | WO 2014073112 A1 | 5/2014 |

* cited by examiner

ELECTRONICS HOUSING

CROSS-REFERENCE TO PRIOR APPLICATION

Priority is claimed to German Patent Application Nos. DE 20 2016 002 626.8, filed on Apr. 22, 2016, and DE 10 2016 117 451.3, filed on Sep. 16, 2016, the entire disclosures of which are hereby incorporated by reference herein.

FIELD

The invention relates to an electronics housing which is used for receiving electro-technical components that may be arranged in the interior of a housing body of the electronics housing and also on the outside of the housing body of the electronics housing.

BACKGROUND

Electronics housings of the type in question are known, for example, from DE 10 2009 055 817 B4, and have a housing body for receiving and housing electronic components, for example in the form of printed circuit boards equipped with electronic components, a cover, which can be pivoted about a pivot pin and covers a portion of the housing body, being provided on the housing body.

Furthermore, housings of the type in question are known from JPH 0631 522 Y2 and also from WO 2014 073 112, which disclose an electronics housing of the type in question comprising a housing body for receiving electronic components, in which a cover is provided which is arranged on the housing body so as to be pivotable about a pivot pin, formed on a bearing point, between an open position and a closed position.

In this case, locking means are provided which pivotally lock the cover in at least one pivot angle position by means of an interlocking connection, which can be released without destruction, between at least a first locking member and a second locking member, actuation of the cover for pivoting from the pivot angle position into a further pivot angle position bringing about a release of the pivotally locked interlocking connection.

In this case, the cover is used to cover the housing body of the electronics housing in portions and thus, for example, to protect the interfaces/contact points arranged in the relevant region, for example plug-in connectors and cables inserted in contact points.

In order to make the relevant region more accessible, it is possible to pivotally lock the cover in at least one pivot angle position by the cooperation of a first locking member and a second locking member, in order to prevent undesired pivoting of the cover.

SUMMARY

In an embodiment, the present invention provides an electronics housing comprising: a housing body configured for attachment to a mounting rail and on which a cover is arranged which is pivotable about a pivot pin, formed on a bearing point, between an open position and a closed position; and a locking device configured to pivotally lock the cover in at least one pivot angle position via an interlocking connection, which is configured to be released without destruction, between at least a first locking member and a second locking member, wherein, spaced apart from the bearing point in a radial pivot pin direction, the first locking member is arranged on the housing body and the second locking member is arranged on the cover and configured such that an actuation of the cover for pivoting out of the pivot angle position results in a resilient deformation of the first locking member and/or second locking member, directed radially with respect to the pivot pin, to release the interlocking connection.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

The figures of the drawings show a possible embodiment of an electronics housing according to the invention, in a schematic illustration in each case.

Figure 1:
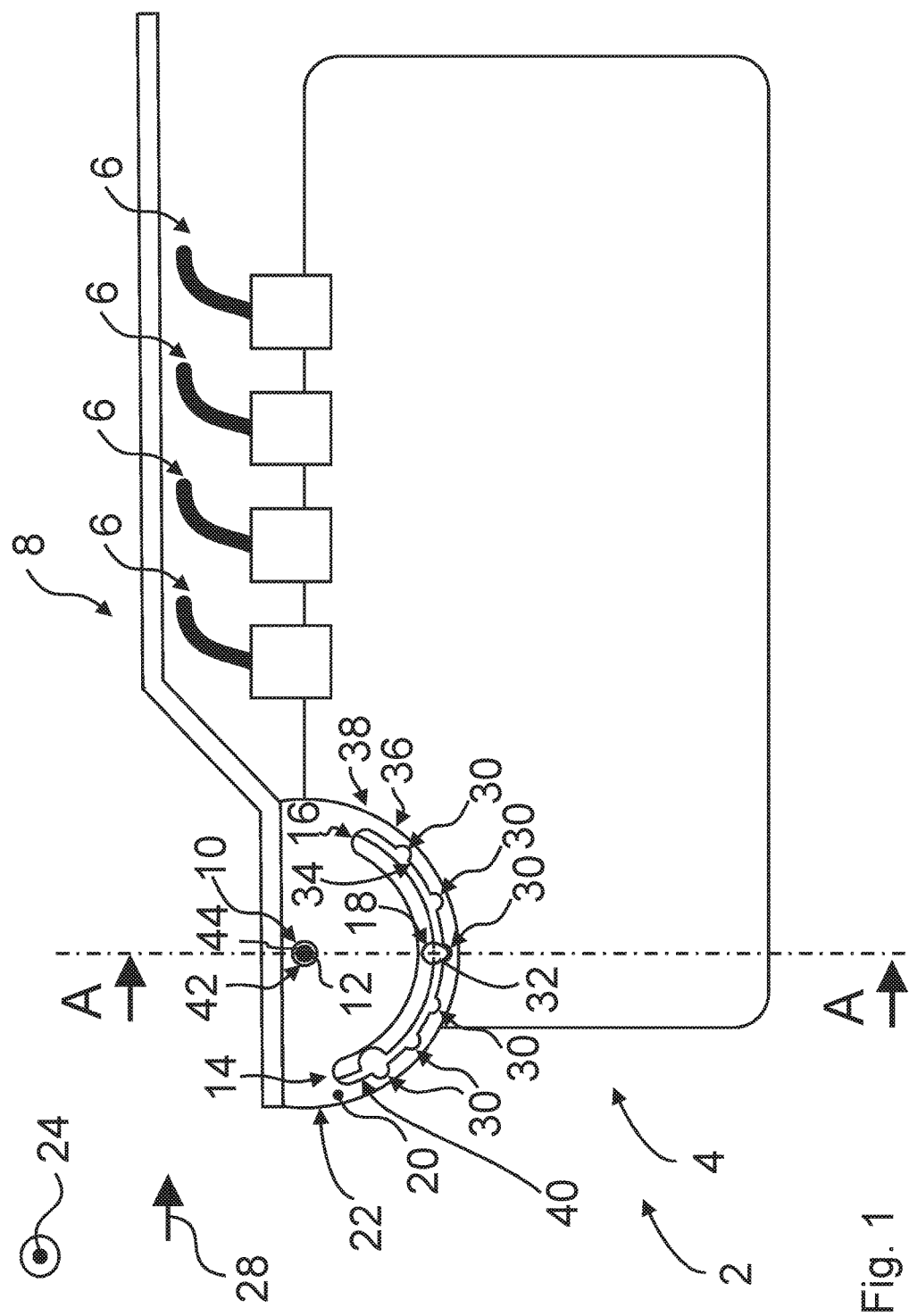

The illustrations in the figures are therefore in particular not true to scale and, for improved clarity, are reduced to the elements/parts/components that aid understanding.

In the figures, the same or corresponding parts/components or elements are provided with the same reference signs.

For improved clarity, not all the elements/parts/components are always provided with references in the figures, the association resulting from the same illustration or an illustration adapted to the view.

Figure 2:
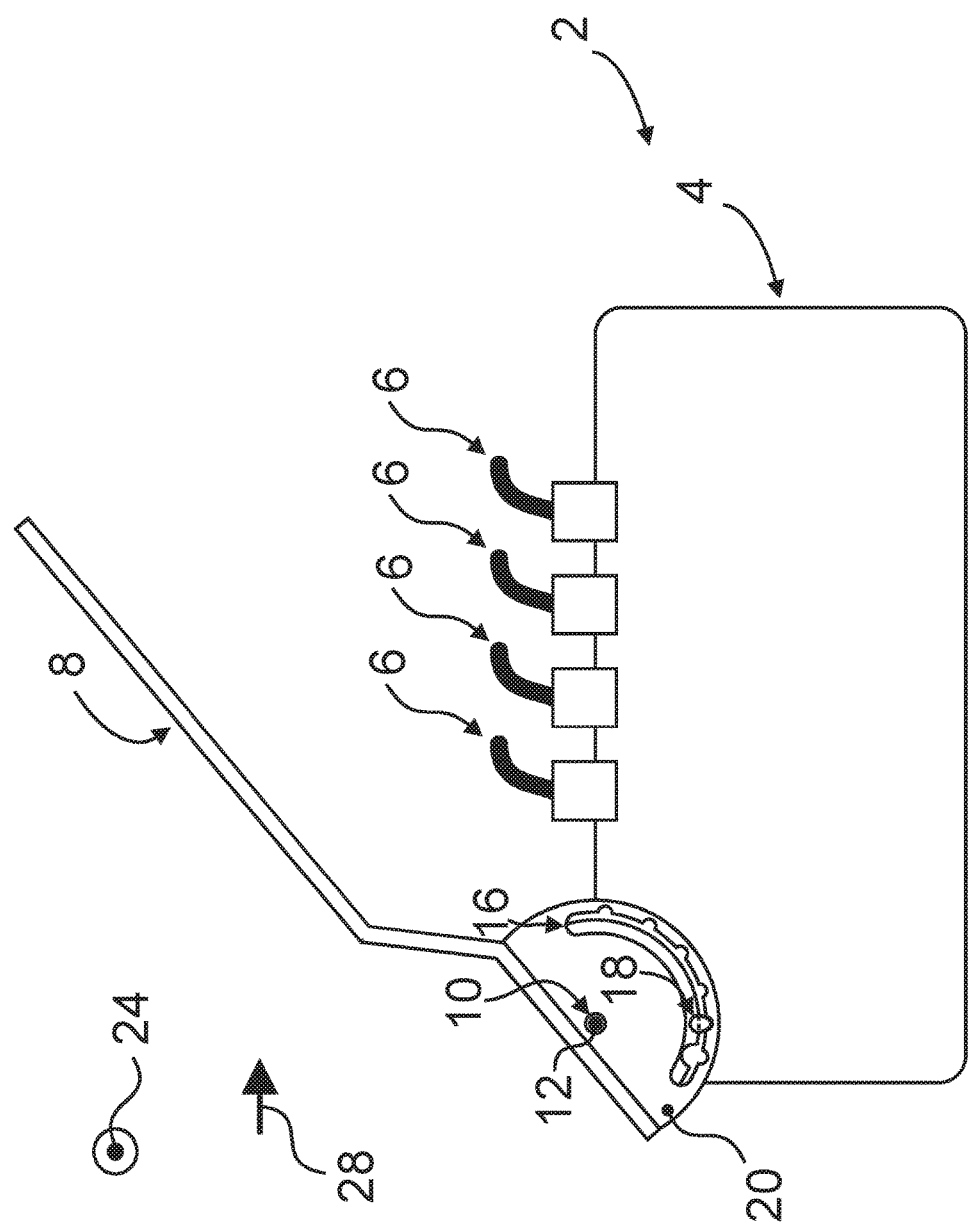
Figure 3:
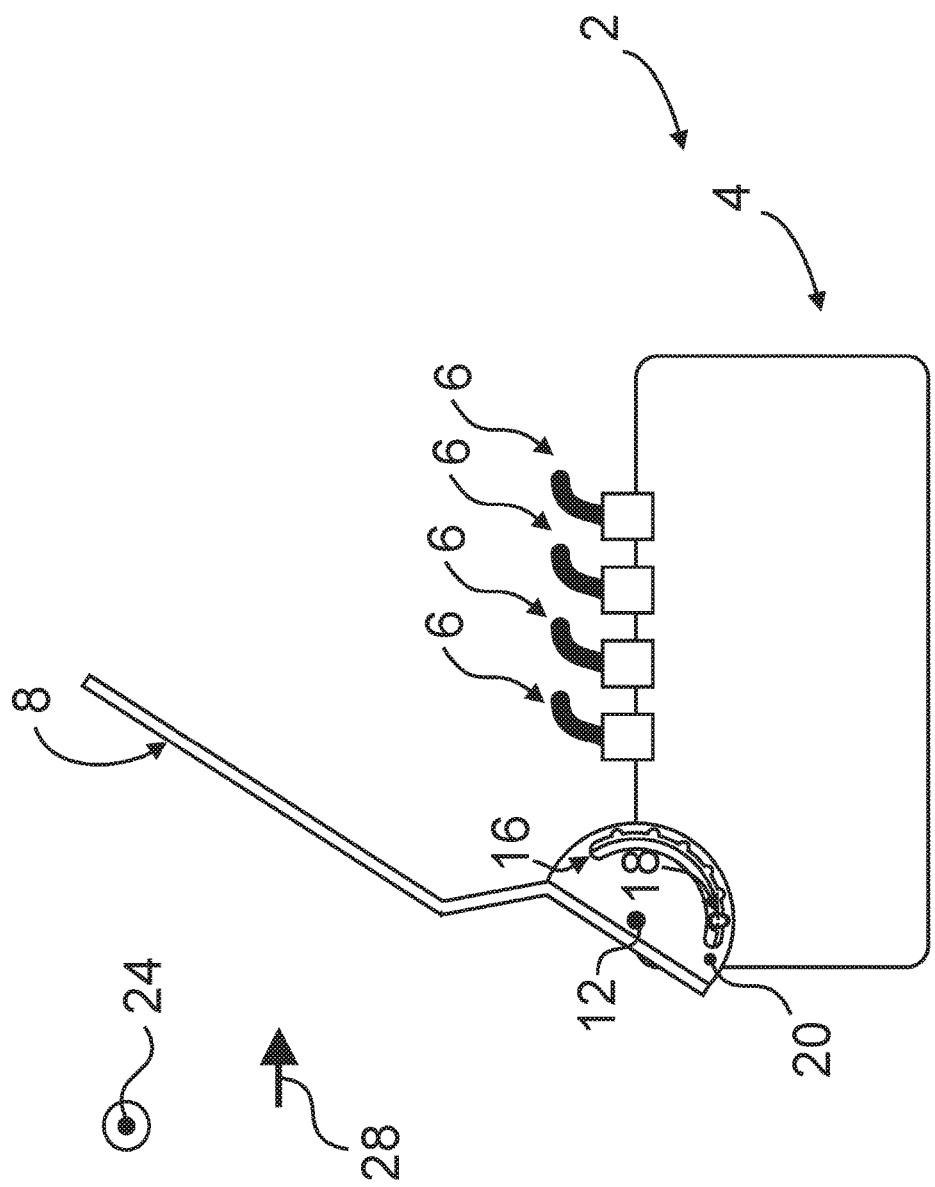
Figure 4:
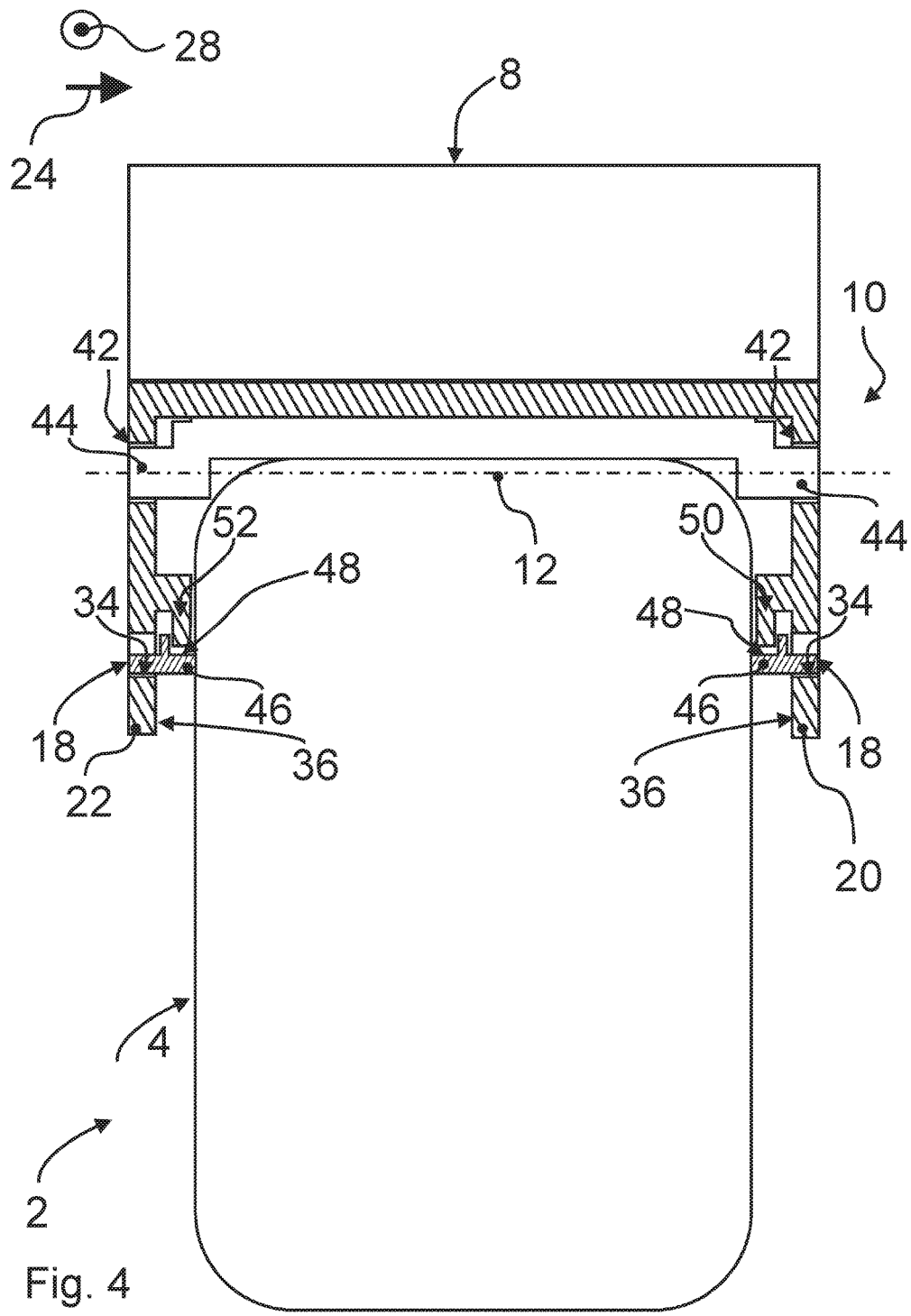

In the drawings:

FIG. 1 is a schematic side view of an embodiment of an electronics housing according to the invention, FIG. 2 is a further schematic side view of the embodiment of an electronics housing according to the invention from FIG. 1, in a different size ratio from the illustration in FIG. 1, the cover being in a pivotal position between the open position and the closed position, FIG. 3 is a further schematic side view of the embodiment of an electronics housing according to the invention from FIG. 1, in a different size ratio from the illustration in FIG. 1 and also FIG. 3, the cover being in an open position, FIG. 4 is a sectional view of the electronics housing along the line denoted A-A in FIG. 1, in otherwise the same mode of illustration as in FIG. 1, but in a different size ratio from the illustration in FIG. 1, the housing body of the electronics housing, in particular, not being shown in cross section.

DETAILED DESCRIPTION

The invention firstly provides that, in a correspondingly inventive electronics housing, in each case spaced apart from the bearing point in the radial pivot pin direction, the first locking member is arranged and formed on the housing body and the second locking member is arranged and formed on the cover in such a way that an actuation of the cover for pivoting out of the pivot angle position brings about a resilient deformation of the first locking member and/or second locking member, directed radially with respect to the pivot pin, in order to release the interlocking connection.

The aforementioned actuation of the cover is used to produce an interlocking connection-releasing torque, which in turn brings about a resilient deformation of the first locking member and/or the second locking member, directed radially with respect to the pivot pin, in order to release the interlocking connection.

The invention is advantageous in that only design measures which ensure a secure hold of the cover on the housing body are necessary.

In this case, a secure hold of the cover in an open position and also a closed position of the cover can be achieved, in which the region to be covered by the cover is accessible or covered. In addition, undesired/unwanted pivoting of the cover for the housing body about the pivot pin is effectively prevented by a pivotal locking.

Furthermore, the invention is advantageous in that the design of the locking members is independent of the design of the bearing point and is therefore not subject to any associated restrictions of the embodiment.

Furthermore, it is advantageously achieved by the invention that, upon actuation of the cover in order to release the aforementioned interlocking connection between the locking members, no forces are produced in the axial pivot pin direction that impair a secure hold of the cover on the housing body.

Within the context of the invention, a use state of an electronics housing according to the invention is assumed, in which the electronics housing can be used for the provided intended purpose of housing electronic components.

According to the invention, electronic components are understood to mean individual parts and also combinations, for example by means of printed circuit boards, which also comprise electric components, such as electrical conductors, plug-in connectors, electrical ports, mounts and the like.

In particular, the cover of an electronics housing according to the invention is used, in particular, to cover, and thus also protect, an interface or contacting point by means of which the components arranged in or on the housing body can be connected to an energy source or other electronic components or electronics housings. In this case, according to the invention, the interface or contacting point may have a plurality of connection points or contact points, such as plug-in connectors, in order to be able to relay electrical currents or signals. However, the invention is not limited thereto and therefore, for example, displays or actuators can also be protected by the cover.

According to the invention, to achieve multiple use and for space-saving reasons, a cover can be used so that information for assignment of the aforementioned connection points/interfaces or contacting points, for example plug-in connectors, can be arranged on the cover in order to achieve simpler inspection and better detection of assignments.

Against this background, a corresponding cover may be transparent or partly transparent, or transparent or partly transparent at least in portions, as a result of which corresponding regions on the cover can be provided for display/inspection or attachment of information and can be used accordingly.

Within the context of the invention, an axial direction with respect to the pivot pin is also referred to as an axial pivot pin direction, and a radial direction with respect to the pivot pin is also referred to as a radial pivot pin direction.

According to an advantageous development of the invention, the cover of an electronics housing according to the invention is designed in such a way that the cover comprises at least one disc-shaped side wall, on which the first locking member is arranged, in particular molded.

In this case, the disc-shaped side wall is arranged on a face of the cover which is formed in the axial direction. Within the context of the invention, the cover is, in particular, produced by a strip element that is elongate in the radial pivot pin direction and has its largest extent compared to its further dimensions in particular in this direction.

Arranged on the faces of said cover which are formed in the axial direction with respect to the pivot pin (axial pivot pin direction), is at least one side wall which is disc-shaped and the disc extent of which is in the radial direction with respect to the pivot pin. In this respect, a side wall has its greatest extent compared with its further dimension (disc thickness) in the radial pivot pin direction. The side wall is preferably formed by a thin planar body in order to, inter alia, allow weight savings and easy producibility.

For further simplification of an electronics housing according to the invention, an advantageous development of the invention provides that the disc-shaped side wall comprises a bearing point part which cooperates with a bearing point part that is associated with this bearing point part and is arranged on the housing body, in order to hold the cover on the housing body so as to be pivotable about the pivot pin.

As a result, it is possible, according to the invention, to assume various functions on a disc-shaped side wall and to achieve them accordingly. This results in production and cost advantages, and ultimately advantages in handling for attachment and alignment of the cover on the housing body.

The handling of an electronics housing according to the invention is improved by means of a further advantageous development of the invention in that the cover comprises at least two disc-shaped side walls which are arranged so as to be spaced apart and in parallel with one another in the axial pivot pin direction and between which a bearing point part formed on the housing body is arranged at least in portions.

Such an embodiment according to the invention of an electronics housing makes it possible to achieve pivotal mobility of the cover in an economical manner.

Furthermore, it is thus possible to produce the cover on the housing body without tools, in particular in an interlocking manner. This may, for example, take place by means of a snap connection of the bearing point parts. Within the context of the invention, it is preferably provided that the part of the bearing point located on the housing body is produced by pins which extend in the axial pivot pin direction and project, at least in portions, into recesses formed for this on the side walls or cooperate with said recesses in order to pivotably arrange or mount the cover on the housing body. The side walls are therefore preferably able to bend in a resiliently flexible manner relative to one another in the axial direction, as a result of which simple attachment to the housing body is made possible.

The design according to the invention of the electronics housing achieves a secure hold of the cover that is thereby made possible and also easy handling while attaching the cover to the housing body.

Contamination on the electronics housing, which may be occur during long-term use and also in adverse environments, and also the action of foreign bodies, ensure that a pivotal movement can result in detachment of the cover from the bearing point formed on the housing body. This may, for example, occur in that, when the cover is pivoted, the side wall(s) bends/bend in the axial direction with respect to the pivot pin because of the deposits caused by the aforementioned circumstances.

In addition, an advantageous development of the invention provides that the second locking member comprises at least one pin which extends in the axial pivot pin direction and which in turn, in particular, has a groove-shaped recess in which an edge formed on the disc-shaped side wall is guided in such a way that bending deformation of the side wall in the axial pivot pin direction is prevented or reduced, at least in portions.

This makes it possible to easily and also economically protect the deformation in the axial pivot pin direction.

A resilient effect may be achieved by the selection of the material and by the design configuration. To avoid the use of different materials or to obtain the desired inherent stiffness of the cover, within the context of the invention, the advantageous development has arisen of using a resilient deformability in a predominant manner compared with a proportion of material elasticity.

Therefore, it is possible according to the invention to use material having a low elasticity or a low deformability and by corresponding design measures for producing resilient elements/components. In this respect, the desired deformability is achieved by the inventive design measures. Therefore, advantages in the load capacity of the cover and the material selection are linked so a material having low elasticity can also be used, which material can be resiliently deformed on account of the aforementioned design.

In this respect, the corresponding advantageous development of the invention provides that the first locking member and/or the second locking member are designed and formed for resilient deformation in such a way that the resilient deformability is determined by shape. Therefore, for producing a desired resilient deformation, the influence of the material is reduced compared with that of the shape and is therefore lower, and therefore the shape is predominant compared with the material elasticity for producing the resilient deformability.

In this case, the resilient deformability determines to what extent a deformation is resiliently made possible without an undesired plastic deformation or a break occurring.

An interlocking connection between joining partners can take place according to the invention in many ways. To assist a secure hold of the cover on the housing body, it is provided in a further advantageous development of the invention that the first locking member and second locking member join together in the radial pivot pin direction for the interlocking connection. Thus, an axial force development is prevented by the joining process, as a result of which the secure hold of the cover on the housing body is not reduced, even temporarily.

For an easy and economical implementation for bringing about a resilient deformation, an additional advantageous development of the invention provides that, for interlocking joining between the first locking member and second locking member or for a separation of the aforementioned interlocking connection, the first locking member and second locking member are designed, formed and arranged with respect to one another in such a way that their cooperation brings about the resilient deformation for interlocking joining between the first locking member and second locking member and/or a release between the first locking member and second locking member of the interlocking connection.

Within the context of the invention, a shape-resilient deformation is predominantly or in particular necessary to release the interlocking connection between the first locking member and second locking member, the aforementioned joining also being included according to the invention, however, in the manner in which it is taken into account in a further advantageous development in that the first locking member and second locking member are designed, formed and arranged with respect to one another in such a way that their cooperation brings about a spring force-loaded joining for the interlocking connection between them.

Advantageously, further components, which ensure a release of the interlocking connection between the first locking member and second locking member or are necessary for a corresponding joining, can thus be dispensed with. The advantages achieved are predominantly a simpler design of an electronics housing according to the invention, together with the cost, handling and production advantages associated therewith.

In order to achieve an interlocking connection between the first locking member and second locking member, it is provided within the context of the invention that the locking members as such do not have to be shaped so as to be completely matched to one another, but only components are used for an interlocking connection, and therefore the production accuracy can be concentrated on these components, resulting in the corresponding advantages of economic production and matching of the components to one another.

For this purpose, a relevant advantageous development of the invention provides that the first locking member comprises at least one shaped element which cooperates with a shaped element of the second locking member for an interlocking connection, the shaped elements being matched to one another for an interlocking connection, in particular being shaped so as to be complementary to one another at least in portions.

By means of a complementary shaping at least in portions, it is possible to design the interlocking connection having a desired pivotal locking in a simple manner.

For a simple design of an interlocking connection, an advantageous development of the invention provides that the first locking member forms a side which contacts the second locking member in a manner loaded with spring force, at least in portions, and the shaped element of which is interlockingly inserted in the joining element formed on the side when the cover reaches a predetermined pivot angle position, and/or that the second locking member forms a side which contacts the first locking member in a manner loaded with spring force, at least in portions, and the shaped element of which is interlockingly inserted in the joining element formed on the side for a pivotal locking when the cover reaches the pivot angle position.

In this case, the pivot angle position(s) can be set at random, in particular in such a way as to achieve or make possible, for example, an adequate accessibility of the regions covered by the cover or to ensure a covering of the relevant region in various pivot angle positions of the cover.

It is provided that a path is formed by a locking member by means of a side, in which path joining elements, for example recesses or projections, are provided, by means of which the pivot angle position(s) for the cover can be established. In order that the cover can be held in a pivotally locking manner in the provided pivot angle position, cooperation with the remaining locking member is provided. In the process, it is taken into account that the sides can also be formed on both the locking members.

To simplify the effort for producing the cooperation for a pivotal locking of the cover, a further advantageous development of the invention provides that the second locking member is arranged on the housing body in a fixed position. Thus, an electronics housing according to the invention can be economically produced and, also, the pivot angle positions in which the locking members are intended to lock the cover can be produced in a simple manner.

An economical possibility for implementation is provided by a further advantageous development of the invention in that the first locking member is molded, by at least its free end, on the side wall as a resilient bending arm, and at least one shaped element is arranged on the side of said locking member facing the pivot pin and/or on the side thereof remote from the pivot pin, which is in turn arranged on the housing body.

Thus, the second locking member can be designed correspondingly more simply, for example as a pin, which correspondingly cooperates with the bending arm.

According to the invention, this also includes an action reversal, such that the second locking member can also be correspondingly designed and therefore the first locking member can in turn be designed correspondingly more simply.

Within the context of the invention, it is possible to design the cover in many ways. A further advantageous development of the invention provides advantages in that the cover is formed in one piece.

Advantages achieved according to the invention are associated therewith, in particular in the handling, the production and also the logistics of a correspondingly designed cover of an electronics housing according to the invention, which ultimately also lead to cost advantages.

A further advantageous development of the invention is based on the fact that the housing body is designed and formed for attachment to a mounting rail. According to the invention, this achieves the advantage of simplified assembly or disassembly of a housing according to the invention for its intended use. Furthermore, it is thereby possible to arrange an electronics housing according to the invention at predetermined places without particular outlay being necessary for its alignment or attachment, resulting in time and cost advantages. This also results in improved handling of an electronics housing formed according to the invention for its predetermined arrangement.

The electronics housings can be used in diverse ways. They are advantageously intended for arrangement in a switch cabinet, as a result of which they are easily protected for their intended purpose by the switch cabinet and can be signal-connected to further electronics housings in a space saving manner. Accordingly, a further advantageous development of the invention provides the use of an electronics housing for arrangement in a switch cabinet.

The invention will be described in more detail in the following with reference to the accompanying drawings, in which an embodiment of an electronics housing according to the invention is shown in order to represent a plurality of electronics housings according to the invention.

In this case, all the features that are claimed, described and shown in the drawings form the subject matter of the invention, independently and in any combination with one another, regardless of their combination in the claims and their dependency references and regardless of their description or illustration in the drawings.

In the following, for improved clarity, when the structure is the same or similar, the description is reduced to the differences between the embodiments or figures.

FIG. 1 is a schematic side view of the embodiment of an electronics housing 2 according to the invention (referred to in the following as electronics housing 2 for short).

The electronics housing 2 comprises a housing body 4 for receiving electronic components 6, the electronic components 6 arranged on the outside being shown representatively in this embodiment by lines which are received in plug-in connectors that are accessible from the outside and are used for electrically contacting the electronic components received in the interior of the housing body 4, and being provided with the same reference sign.

The electronics housing 2 comprises a cover 8 which is arranged on the housing body 4 so as to be pivotable about a pivot pin 12, formed on a bearing point 10, between an open position and a closed position (as shown in FIG. 1).

Furthermore, locking device 14 are provided which pivotally lock the cover 8 in a pivot angle position by means of an interlocking connection, which can be released without damage, between at least a first locking member 16 and a second locking member 18.

In this case, the pivotal actuation of the cover 8 brings about a torque, by means of which an interlocking connection-releasing torque is reached or exceeded.

It is provided here that, spaced apart from the bearing point 10 in the radial pivot pin direction 28, the first locking member 16 is arranged and formed on the cover 8 and the second locking member 18 is arranged and formed on the housing body 4 in such a way that an actuation of the cover 8 for pivoting out of the pivot angle position brings about a resilient deformation of the first locking member 16 and/or second locking member 18, directed radially with respect to the pivot pin 12, in order to release the interlocking connection.

The cover 8 comprises two disc-shaped side walls 20, 22, on which a first locking member 16 (all denoted by reference sign 16) is formed in each case, the disc-shaped side walls 20, 22 being arranged so as to be spaced apart and in parallel with one another in the axial pivot pin direction 24 (illustrated by a circled dot symbol in FIG. 1 to FIG. 3) and between which a bearing point part 44 formed on the housing body 4 is arranged, at least in portions (visible from FIG. 4).

Furthermore, the first locking member 16 is designed and formed for a resilient deformation in such a way that the resilient deformability is determined by shape.

It is provided here that the first locking member 16 and second locking member 18 join in the radial pivot pin direction 28 for the interlocking connection.

It is moreover provided that the first locking member 16 and second locking member 18 are designed, formed and arranged with respect to one another in such a way that cooperation between them brings about the resilient deformation for releasing the interlocking connection.

It is furthermore taken into account that the first locking member 16 and second locking member 18 are designed, formed and arranged with respect to one another in such a way that their cooperation brings about a spring force-loaded joining for the interlocking connection between them.

The first locking member 16 comprises a plurality of shaped elements 30 (all denoted by reference sign 30) which cooperate, for an interlocking connection, with a shaped element 32 of the second locking member 18 provided for the interlocking connection, the shaped elements 30, 32 being matched to one another for an interlocking connection and being shaped so as to be complementary to one another.

The first locking member 16 (denoted in FIG. 1/2/3 for improved clarity) forms a side 34 which serves as a guide for the second locking member 18, which in turn contacts the side 34 in a manner loaded with spring force and the shaped element 32 of which is interlockingly inserted in the joining element 31 formed on the side 34 at the relevant point when the cover 8 reaches a predetermined pivot angle position.

Furthermore, the electronics housing (2) provides that the second locking member 18 is arranged on the housing body (4) in a fixed position.

The first locking member 16 is molded, by its two free ends 38, 40, on the side wall as a resilient bending arm 36, and the shaped elements 30 are arranged on the side of said locking member facing the pivot pin 12.

In this embodiment, the cover 8 is formed in one piece.

Furthermore, the electronics housing 2 is designed and formed for arrangement in a switch cabinet and can be arranged for this purpose on a mounting rail.

FIG. 4 shows the electronics housing in a view denoted by A in FIG. 1, in otherwise the same mode of illustration as in FIG. 1.

As already stated with respect to FIG. 2, the cover 8 comprises two disc-shaped side walls 20, 22 on which a first locking member 16 (all denoted by reference sign 16) is formed in each case, the side walls 20, 22 being arranged so as to be spaced apart and in parallel with one another in the axial pivot pin direction 24. A bearing point part 44 formed on the housing body 4 is arranged between the side walls 20, 22.

It can be seen in FIG. 4 that the respective disc-shaped side walls 20, 22 each comprise a bearing point part 42 (all denoted by reference sign 42) which cooperates with the bearing point part 44 that is associated with this bearing point part 42 and is arranged on the housing body 4, in order to hold the cover 8 on the housing body 4 so as to be pivotable about the pivot pin 12.

The second locking member 18 (located on both side walls and all denoted by reference sign 18) comprises a shaped element 32 (all denoted by reference sign 32), which in turn comprises a pin 46 (all denoted by reference sign 46) extending in the axial pivot pin direction 24 and which in turn has a groove-shaped recess 48 (all denoted by reference sign 48) in which an edge 50, 52 formed on the respective disc-shaped side walls 20, 22 is guided in such a way that a bending deformation of the respective side walls 20, 22 in the axial pivot pin direction 24 is prevented or reduced.

Furthermore, both the housing body 4 and the cover 8 are produced from plastics material.

The cover 8 has been created from a transparent plastics material having a low material elasticity. Differing from this, a different plastics material, which better assists the electrically insulating housing properties, has been used to produce the housing body 4.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An electronics housing comprising:
   a housing body configured for attachment to a mounting rail and on which a cover is arranged which is pivotable about a pivot pin, formed on a bearing point, between an open position and a closed position; and
   a locking device configured to pivotally lock the cover in at least one pivot angle position via an interlocking connection, which is configured to be released without destruction, between at least a first locking member and a second locking member,
   wherein, spaced apart from the bearing point in a radial pivot pin direction, the first locking member is arranged on the cover and the second locking member is arranged on the housing body and configured such that an actuation of the cover for pivoting out of the pivot angle position results in a resilient deformation of at least one of the first locking member or second locking member, directed radially with respect to the pivot pin, to release the interlocking connection,
   wherein the cover comprises at least one disc-shaped side wall on which the first locking member is arranged, and
   wherein the second locking member comprises at least one pin which extends in an axial pivot pin direction and which in turn has a groove-shaped recess in which an edge formed on the disc-shaped side wall is guided such that a bending deformation of the side wall in the axial pivot pin direction is prevented or reduced, at least in portions.

2. The electronics housing according to claim 1, wherein the cover comprises at least one disc-shaped side wall on which the first locking member is arranged.

3. The electronics housing according to claim 2, wherein the disc-shaped side wall comprises at least one bearing point part which cooperates with a corresponding bearing point part that is associated with the at least one bearing point part and is arranged on the housing body, to hold the cover on the housing body so as to be pivotable about the pivot pin.

4. The electronics housing according to claim 2, wherein the first locking member is molded, by at least its one free end, on the disc-shaped side wall as a resilient bending arm, and at least one shaped element is arranged at least one of on a side of the first locking member facing the pivot pin or remote from the pivot pin.

5. The electronics housing according to claim 1, wherein the cover comprises at least two disc-shaped side walls which are arranged so as to be spaced apart and in parallel with one another in an axial pivot pin direction and between which a bearing point part formed on the housing body is arranged at least in portions.

6. The electronics housing according to claim 1, wherein at least one of the first locking member or second locking member are configured for a resilient deformation such that the resilient deformability is determined by shape.

7. The electronics housing according to claim 1, wherein the first locking member and second locking member join together in the radial pivot pin direction for the interlocking connection.

8. The electronics housing according to claim 1, wherein the first locking member and second locking member are configured and arranged with respect to one another such that cooperation between them results in a spring force-loaded joining for the interlocking connection between them.

9. The electronics housing according to claim 1, wherein the first locking member comprises at least one shaped element which cooperates with at least one shaped element of the second locking member for the interlocking connection, the shaped elements being complementary to one another, at least in portions.

10. The electronics housing according to claim 1, wherein at least one of:
  the first locking member forms a side which contacts the second locking member in a manner loaded with spring force, and the shaped element of which is interlockingly inserted in the at least one shaped element of the second locking member, formed on the side, when the cover reaches the pivot angle position, or
  the second locking member forms a side which contacts the first locking member in a manner loaded with spring force, and the shaped element of which is interlockingly inserted in the at least one shaped element of the first locking member, formed on the side, when the cover reaches the pivot angle position.

11. The electronics housing according to claim 1, wherein the second locking member is arranged on the housing body in a fixed position.

12. The electronics housing according to claim 1, wherein the cover is formed in one piece.

* * * * *